United States Patent
Seshadri et al.

(10) Patent No.: US 8,560,931 B2
(45) Date of Patent: Oct. 15, 2013

(54) LOW POWER RETENTION RANDOM ACCESS MEMORY WITH ERROR CORRECTION ON WAKE-UP

(75) Inventors: Anand Seshadri, Richardson, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 13/483,897

(22) Filed: May 30, 2012

(65) Prior Publication Data
US 2012/0324314 A1    Dec. 20, 2012

Related U.S. Application Data

(60) Provisional application No. 61/498,439, filed on Jun. 17, 2011, provisional application No. 61/551,523, filed on Oct. 26, 2011.

(51) Int. Cl.
 *G06F 11/00* (2006.01)
 *H03M 13/00* (2006.01)
 *G11C 5/14* (2006.01)

(52) U.S. Cl.
USPC ...... 714/801; 714/758; 714/766; 365/189.09; 365/226

(58) Field of Classification Search
USPC ......... 714/801, 800, 799, 805, 752, 758, 763, 714/764, 766, 767, 769, 772–773, 786, 25, 714/48, 52, 54; 365/189.011, 189.09, 200, 365/201, 226, 220
See application file for complete search history.

(56) References Cited

U.S. PATENT DOCUMENTS

| | | | |
|---|---|---|---|
| 6,654,305 B2 * | 11/2003 | Tsunoda et al. | 365/226 |
| 7,705,660 B2 * | 4/2010 | Lee | 327/534 |
| 8,218,376 B2 * | 7/2012 | Seshadri et al. | 365/189.09 |
| 8,325,511 B2 * | 12/2012 | Seshadri | 365/154 |

OTHER PUBLICATIONS

Kumar et al., "Fundamental Data Retention Limits in SRAM Standby—Experimental Results", 9th International Symposium on Quality Electronic Design (IEEE, 2008), pp. 92-97.
Qin et al., "Error-Tolerant SRAM Design for Ultra-Low Power Standby Operation", 9th International Symposium on Quality Electronic Design (IEEE, 2008), pp. 30-34.
Kumar et al., "Fundamental Bounds on Power Reduction during Data-Retention in Standby SRAM", International Symposium on Circuits and Systems (IEEE, 2007), pp. 1867-1870.

* cited by examiner

*Primary Examiner* — Christine Tu
(74) *Attorney, Agent, or Firm* — Rose Alyssa Keagy; W. James Brady; Frederick J. Telecky, Jr.

(57) ABSTRACT

Solid-state random access memory including error correction capability applied to memory arrays entering and exiting a data retention mode. Error correction coding of the data to be retained is performed upon determining that a portion of the memory is to enter data retention mode; the parity bits (i.e., bits in addition to those required for storage of the payload) are stored in available memory cells within or external to the retention domain. Upon exit from retention mode, the code words are decoded to correct any errors, and the payload data are returned to the original cells. Error correction encoding and decoding is not performed in the normal operating mode.

23 Claims, 6 Drawing Sheets

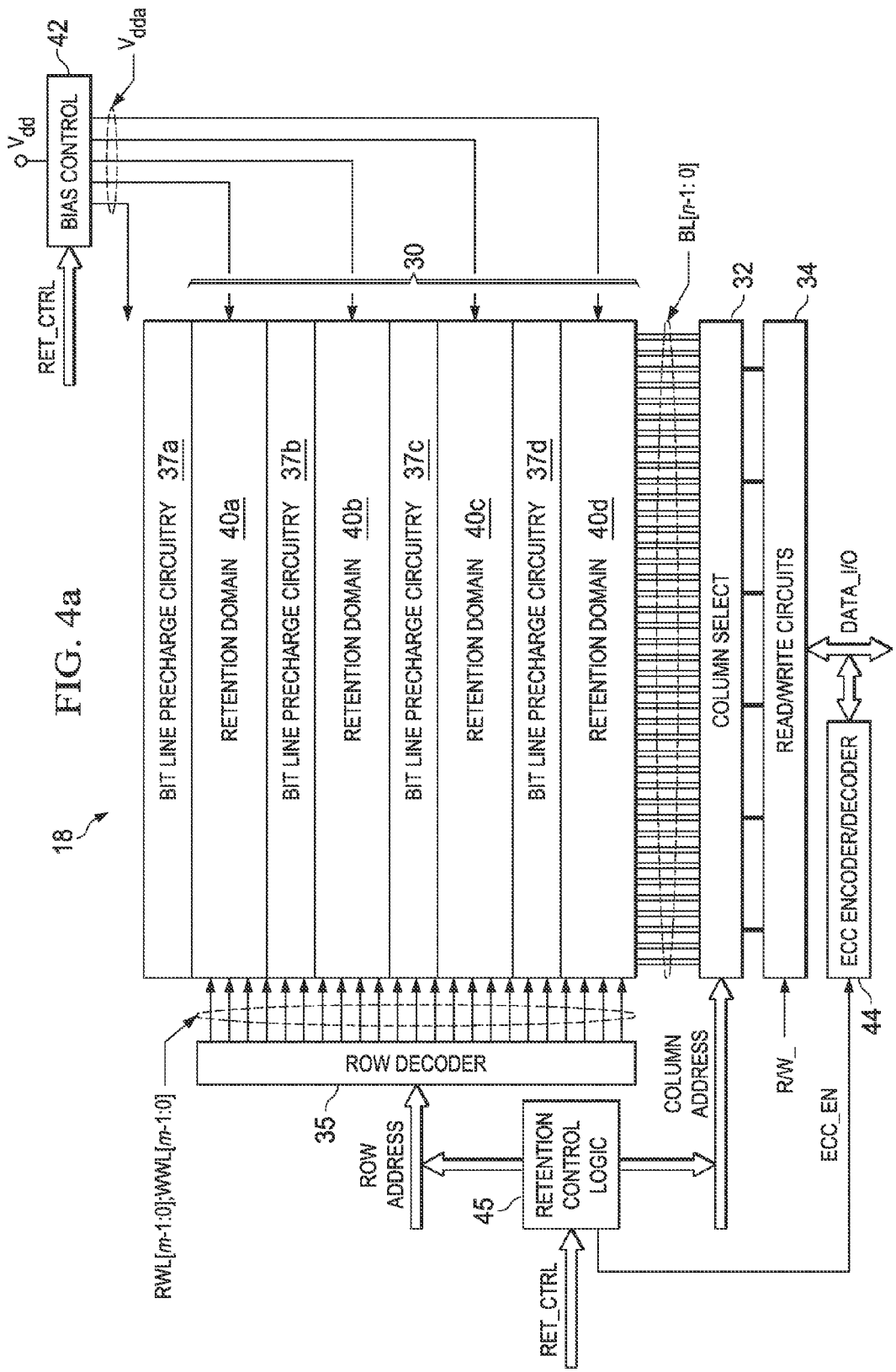

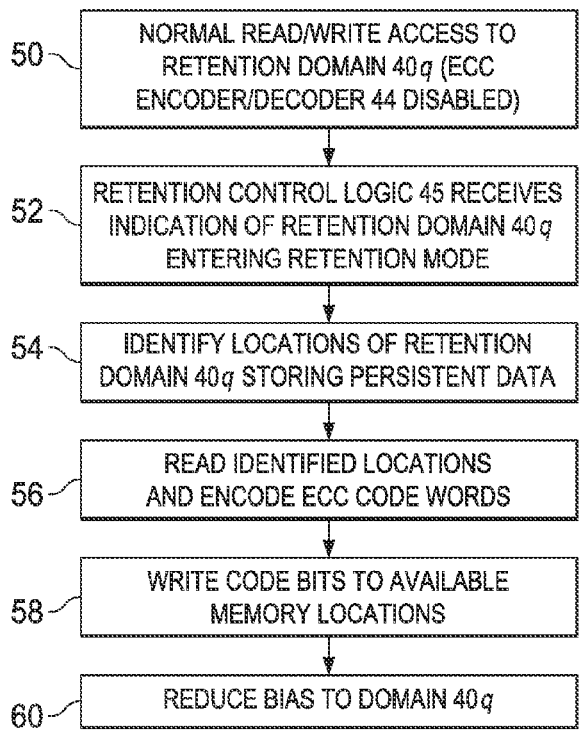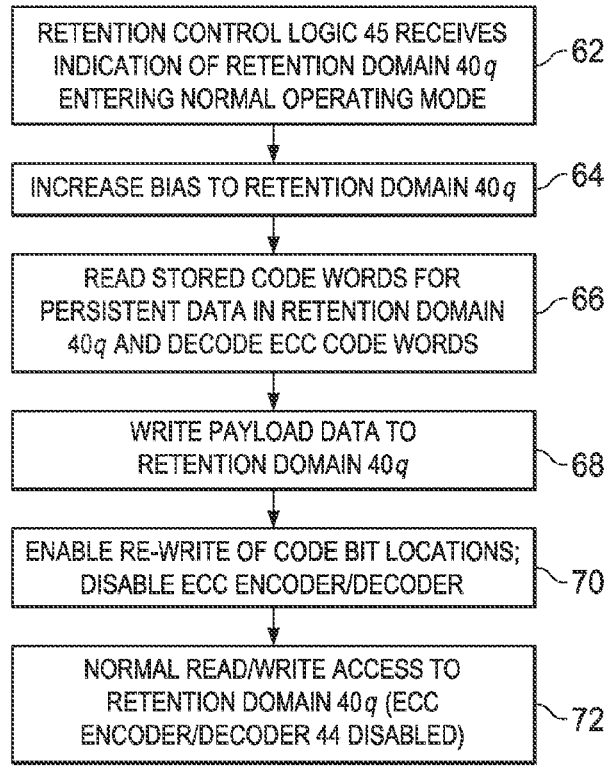

LOW POWER RETENTION RANDOM ACCESS MEMORY WITH ERROR CORRECTION ON WAKE-UP

CROSS-REFERENCE TO RELATED APPLICATIONS

This application claims priority, under 35 U.S.C. §119(e), of Provisional Application No. 61/498,439, filed Jun. 17, 2011; and of Provisional Application No. 61/551,523, filed Oct. 26, 2011, both incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained. However, even when constructed according to complementary metal-oxide-semiconductor (CMOS) technology, SRAM cells conduct some amount of DC current to retain the stored data states.

Designers have recently adopted circuit-based approaches for reducing power consumed by integrated circuits including large memory arrays. One common approach is to reduce the power supply voltage applied to memory arrays, relative to the power supply voltage applied to logic circuitry and circuitry peripheral to the memory array (e.g., decoders, sense amplifiers, etc.). This approach not only reduces the power consumed by the memory array, but also helps to reduce sub-threshold leakage in the individual cells.

Another conventional circuit-based approach to reducing power consumption involves placing the memory functions within the integrated circuit into a "retention" state when possible. In this retention state, the power supply voltages applied to the memory cells in the array reduced to voltages below that necessary for access, but above the minimum power supply voltage required for each cell to retain its stored data state (i.e., the data-state retention voltage, or "DRV"). Typically, both the "$V_{dd}$" power supply voltage applied to the loads of SRAM cells (e.g., the source nodes of the p-channel transistors in CMOS SRAM cells) and also the voltage biasing the transistor body nodes (i.e., the n-well voltage for the p-channel transistors) are reduced in the retention mode. As known in the art, significant recovery time is typically involved in biasing the memory array to an operational state ("wake-up") from the retention state.

To ensure fidelity of the stored data, conventional SRAM arrays are biased, in the retention state, to a power supply voltage that is above the DRV for the worst memory cell in the array. In many instances, this minimum DRV for the worst cell is identified during manufacturing tests for each integrated circuit, and the retention voltage is "trimmed" (by laser or other programming techniques) to satisfy that worst cell DRV, whether the cell is in the primary array or is a redundant replaced cell. Many modern integrated circuits with significant memory resources sub-divide their memories into multiple "retention domains", so that those portions of the overall memory space not currently used can be placed into retention. In those architectures, each retention domain can have its own trimmed retention voltage level, to minimize power consumption in retention where possible. However, increasing the granularity of the retention domains to minimize retention power consumption (i.e., by enabling lower retention power supply voltage levels where possible) increases the chip area required for the memory resources, increases test time, complicates the routing of conductors in the integrated circuit realization, and can increase power consumption during operation.

By way of further background, advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. However, this physical scaling of device sizes does not necessarily correlate to similar scaling of device electrical characteristics. In the context of SRAM cells, the memory cell transistors at currently-available minimum feature sizes conduct substantial DC current due to sub-threshold leakage and other short channel effects. As such, the sub-micron devices now used to realize SRAM arrays have increased the DC data retention current drawn by those arrays.

In addition to increasing the data retention current, the continuing scaling down of device sizes has also increased the variability of electrical characteristics of transistors formed at these extremely small feature sizes. This variability in characteristics has been observed as variations in the data retention capability of SRAM cells within the same array, such variations being evident on a cell-to-cell basis. At power supply voltages below the DRV for an SRAM cell, one failure mechanism is increased sub-threshold leakage through the off-state driver transistor, which overcomes the drive of the load transistor and thus pulls the stored "1" state past the trip voltage of the cell. The sensitivity of the minimum DRV to device variability is especially high in those memories that are at or near their circuit design limits. And, as mentioned above, sub-threshold leakage is exacerbated in SRAM cells constructed of transistors with sub-micron feature sizes. As such, modern SRAM arrays can have a wide range of DRV performance among their memory cells, with the worst DRV exhibited often being quite poor.

By way of further background, the use of error correction coding (ECC) in connection with solid-state memories is well known. As fundamental in this art, error correction coding involves the storage of additional bits (commonly referred to as parity bits, code bits, checksum digits, ECC bits, etc.) that are determined or calculated from the "payload" data bits being encoded. Typically, the storage of error correction coded data in a memory resource involves the encoding and storing of a code word including both the actual data and also the additional parity bits derived according to the selected ECC code. Retrieval of the stored data involves the decoding of the stored code word according to the same code as used to encode the stored code word. Because the parity bits "over-specify" the actual data portion of the code word, some number of errored bits can be tolerated, without any loss of actual data evident after decoding.

Many ECC coding schemes are well known in the art. Examples of well-known ECC codes include Reed-Solomon codes, other BCH codes, Hamming codes, and the like. Typically, the error correction codes used in connection with solid-state memory are "systematic", in that the data portion of the eventual code word is unchanged from the actual data being encoded, with the parity bits appended to the data bits to form the complete code word. The particular parameters for a given error correction code include the type of code, the size of the block of actual data from which the code word is derived, and the overall length of the code word after encoding. In general, the number of errored bits that can be detected and corrected increases with the number of parity bits generated and stored for a payload data word of a given length.

In many large-scale integrated circuits with embedded memory, error correction is performed on retrieved memory data when those data are communicated over a system bus (i.e., as the data are being communicated from an on-chip memory resource to an on-chip destination, such as an on-chip processor). As known in the art, on-chip ECC exacts a performance penalty due to the time required for ECC of each memory access; additional memory cells must also be provided for storage of the parity bits in those integrated circuits.

The use of error correction to overcome errors in an SRAM caused by reducing the power supply voltage during data retention mode to a level below that of the worst case DRV has been described in Kumar et al., "Fundamental Data Retention Limits in SRAM Standby—Experimental Results", *9th International Symposium on Quality Electronic Design* (IEEE, 2008), pp. 92-97; Qin et al., "Error-Tolerant SRAM Design for Ultra-Low Power Standby Operation", *9th International Symposium on Quality Electronic Design* (IEEE, 2008), pp. 30-34; Kumar et al., "Fundamental Bounds on Power Reduction during Data-Retention in Standby SRAM", *International Symposium on Circuits and Systems* (IEEE, 2007), pp. 1867-70. These articles describe SRAM architectures in which an ECC encoder and decoder are provided at the input and output, respectively, of the memory array.

BRIEF SUMMARY OF THE INVENTION

Embodiments of this invention provide a memory and a method of operating the same in which power consumption in a data retention mode is reduced without suffering data loss.

Embodiments of this invention provide such a memory and method in which such improved data retention performance is attained without impacting memory performance in normal operation.

Embodiments of this invention provide such a memory and method in which such improved data retention performance is attained without necessarily increasing the memory array size.

Other objects and advantages of embodiments of this invention will be apparent to those of ordinary skill in the art having reference to the following specification together with its drawings.

Embodiments of this invention may be implemented into an integrated circuit including a memory, and a method of operating the same, in which error correction is applied to data stored while in data retention mode. Upon a portion of the overall memory space being placed in data retention mode, the stored data in that memory space is encoded according to an error correction code; the parity bits of the encoded data are stored in available memory space that will either be active, or brought out of retention at the same time as the payload bits of the encoded data. Upon exit from data retention mode, error correction decoding is performed as part of the "wake-up" sequence, and any errors in the payload bits corrected and stored in memory. Further access to that stored data does not involve error correction, to maximize performance.

Another aspect of this invention can be implemented in such an integrated circuit and method in which the memory space used to store the parity bits for payload data stored in retention mode is recovered upon exit from retention mode for those data. Those storage locations are then available for storage of payload data during operation of the integrated circuit.

BRIEF DESCRIPTION OF THE SEVERAL VIEWS OF THE DRAWING

FIG. 4a through 4c are electrical diagrams, in block form, of the architecture of a random access memory in the integrated circuit of FIG. 1, according to embodiments of the invention.

FIGS. 5a and 5b are flow diagrams illustrating the operation of memory resources in the integrated circuit of FIG. 1 according to an embodiment of the invention.

DETAILED DESCRIPTION OF THE INVENTION

This invention will be described in connection with its embodiments, namely as implemented into a static random access memory (SRAM) architecture, for example as embedded within a larger-scale integrated circuit, because it is contemplated that the invention is beneficial when utilized in such an application. However, it is also contemplated that embodiments of this invention can provide important and significant advantages if applied to other types of read/write solid-state memory, and to such memory when implemented as stand-alone integrated circuits or embedded in other architectures. Accordingly, it is to be understood that the following description is provided by way of example only, and is not intended to limit the true scope of this invention as claimed.

Figure 1:
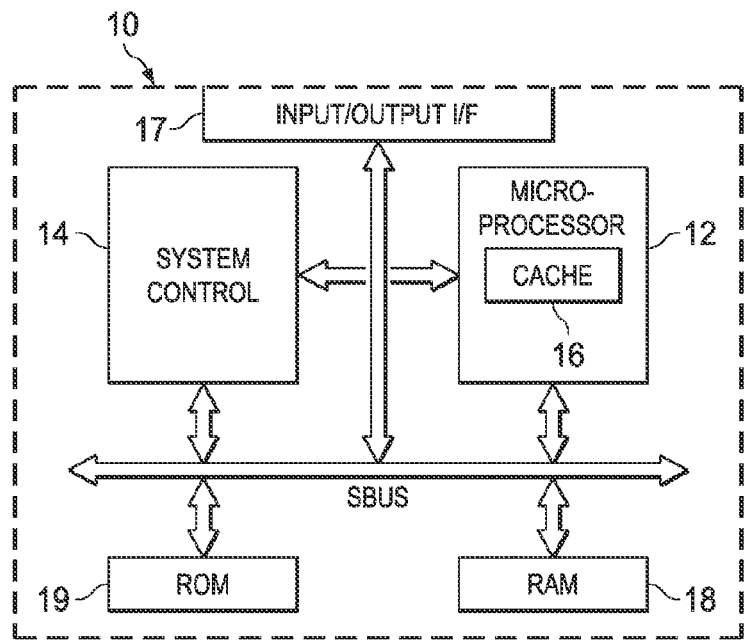
FIG. 1 is an electrical diagram, in block form, of a large-scale integrated circuit in which memory resources are implemented, and to which embodiments of the invention are applied.

FIG. 1 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. Those skilled in the art having reference to this specification will recognize that integrated circuit 10 may include additional or alternative functions to those shown in FIG. 1, or may have its functions arranged according to a different architecture from that shown in FIG. 1. The architecture and functionality of integrated circuit 10 is thus provided only by way of example, and is not intended to limit the scope of this invention. In this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. Typically, ROM 19 serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Figure 2:
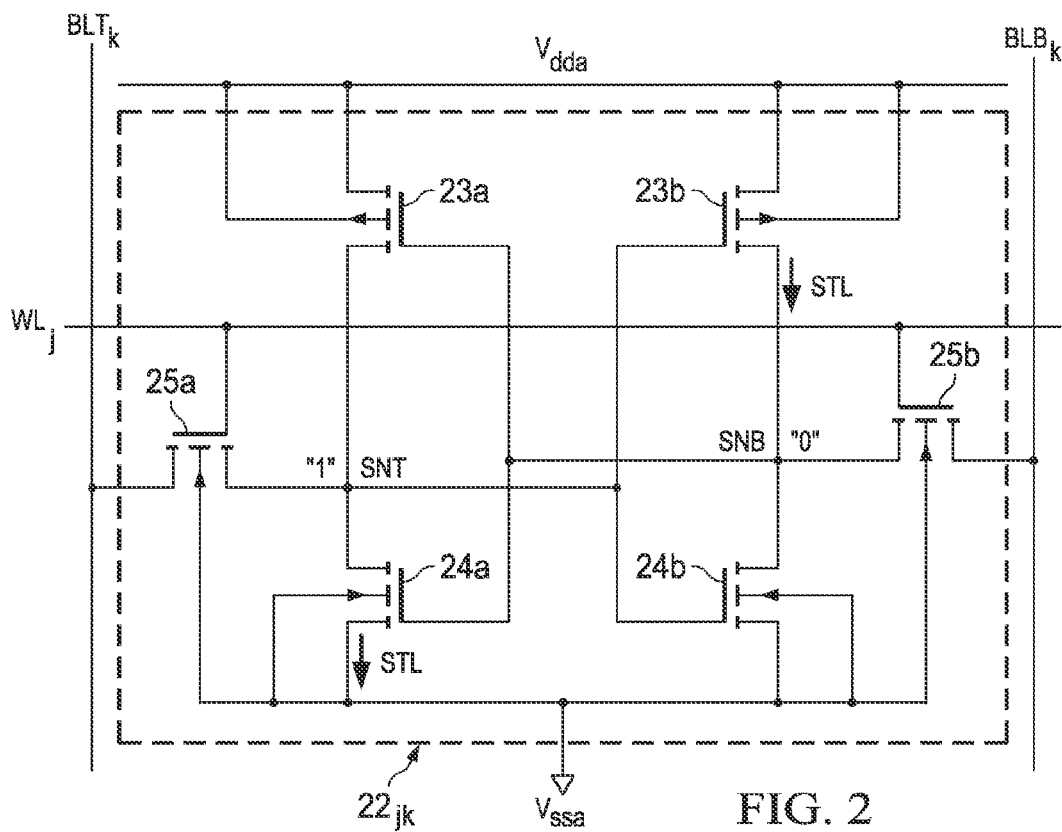
FIG. 2 is an electrical diagram, in schematic form, of a static random access memory cell as used in random access memory resources of the integrated circuit of FIG. 1.

An example of an SRAM cell as utilized in RAM 18 (and perhaps cache memory 16) of integrated circuit 10, is shown in FIG. 2. In this example, SRAM cell $22_{jk}$ is constructed as a conventional six-transistor (6-T) static memory cell, which in this case is in the $j^{th}$ row and $k^{th}$ column of a memory array. SRAM memory cell $22_{jk}$ is biased between the voltage on power supply line $V_{dda}$ and a ground reference voltage $V_{ssa}$. SRAM memory cell $22_{jk}$ is constructed in the conventional manner as a pair of cross-coupled CMOS inverters, one inverter of series-connected p-channel load transistor 23a and n-channel driver transistor 24a, and the other inverter of series-connected p-channel load transistor 23b and n-channel transistor 24b; the gates of the transistors in each inverter are connected together and to the common drain node of the transistors in the other inverter, in the usual manner. The body nodes of p-channel transistors 23a, 23b are biased by power supply voltage $V_{dda}$, typically by way of biasing the n-type well within which those devices are constructed. Similarly, the body nodes of n-channel transistors 24a, 24b, 25a, 25b are biased at ground reference voltage $V_{ssa}$, typically by way of biasing the p-type well within which those devices are constructed. The common drain node of transistors 23a, 24a constitutes storage node SNT, and the common drain node of transistors 23b, 24b constitutes storage node SNB, in this example. N-channel pass-gate transistor 25a has its source/drain path connected between storage node SNT and bit line $BLT_k$ for the $k^{th}$ column, and n-channel pass-gate transistor 25b has its source/drain path connected between storage node SNB and bit line $BLB_k$. The gates of pass-gate transistors 25a, 25b are driven by word line $WL_j$ for this $j^{th}$ row in which cell $22_{jk}$ resides.

In operation, bit lines $BLT_k$, $BLB_k$ are typically precharged to a high voltage (at or near power supply voltage $V_{dda}$), and are equalized to the same voltage. To access cell $22_{jk}$ for a read operation, word line $WL_j$ is then energized, turning on pass-gate transistors 25a, 25b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell $22_{jk}$ to latch in the desired state. In the example of FIG. 2, for purposes of describing the context of this invention, cell $22_{jk}$ is storing a "1" data state, with storage node SNT pulled high by load transistor 23a being turned on (and driver transistor 24a turned off), and storage node SNB pulled low by driver transistor 24b being turned on (and load transistor 23b turned off). When not accessed, pass transistors 25a, 25b are both turned off (word line $WL_j$ held at a low level), isolating storage nodes SNT, SNB from bit lines $BLT_k$, $BLB_k$, respectively.

As known in the art, some level of DC power is consumed by cell $22_{jk}$ in retaining its stored data state, even though one transistor in each of the cross-coupled inverters is in its off state. The off-state transistors 23b, 24a (in the example of FIG. 2) exhibit some source/drain leakage, generally referred to in the art as "sub-threshold leakage", along with and gated diode leakage (GDL); those currents are shown as currents STL in FIG. 2. As such, the power consumed by cell $22_{jk}$ in retaining its stored data state is the product of power supply voltage $V_{dda}$ and the leakage current through both inverters. As known in the art, and as discussed above, many modern SRAM memories are capable of lowering power supply voltage $V_{dda}$ (and also modulating the n-well voltage biasing the body nodes of p-channel transistors 23a, 23b, for example by raising the n-well voltage to reduce sub-threshold leakage) in order to minimize this power consumption.

However, as MOS transistor channel lengths become smaller with continued technology scaling, such lengths now well into the sub-micron regime, sub-threshold source/drain leakage tends to increase. Sub-threshold leakage adversely affects the minimum data retention voltage (DRV) of power supply voltage $V_{dda}$, below which cell $22_{jk}$ no longer can retain its stored data state. With reference to FIG. 2, the loss of the stored data state (a "1" data state in this example) occurs upon the sub-threshold leakage STL through p-channel load transistor 23b and n-channel driver transistor 24a resulting in storage node SNT being pulled to a sufficiently low voltage as to "trip" the state of the cross-coupled inverters. The particular DRV of cell $22_{jk}$ depends on the relative strength among its transistors 23, 24. Especially at the deep sub-micron feature sizes now used to realize solid-state memory, cell-to-cell variability (indeed, transistor-to-transistor variability) results in the DRV varying widely among cells 22 in a given memory array.

Figure 3:
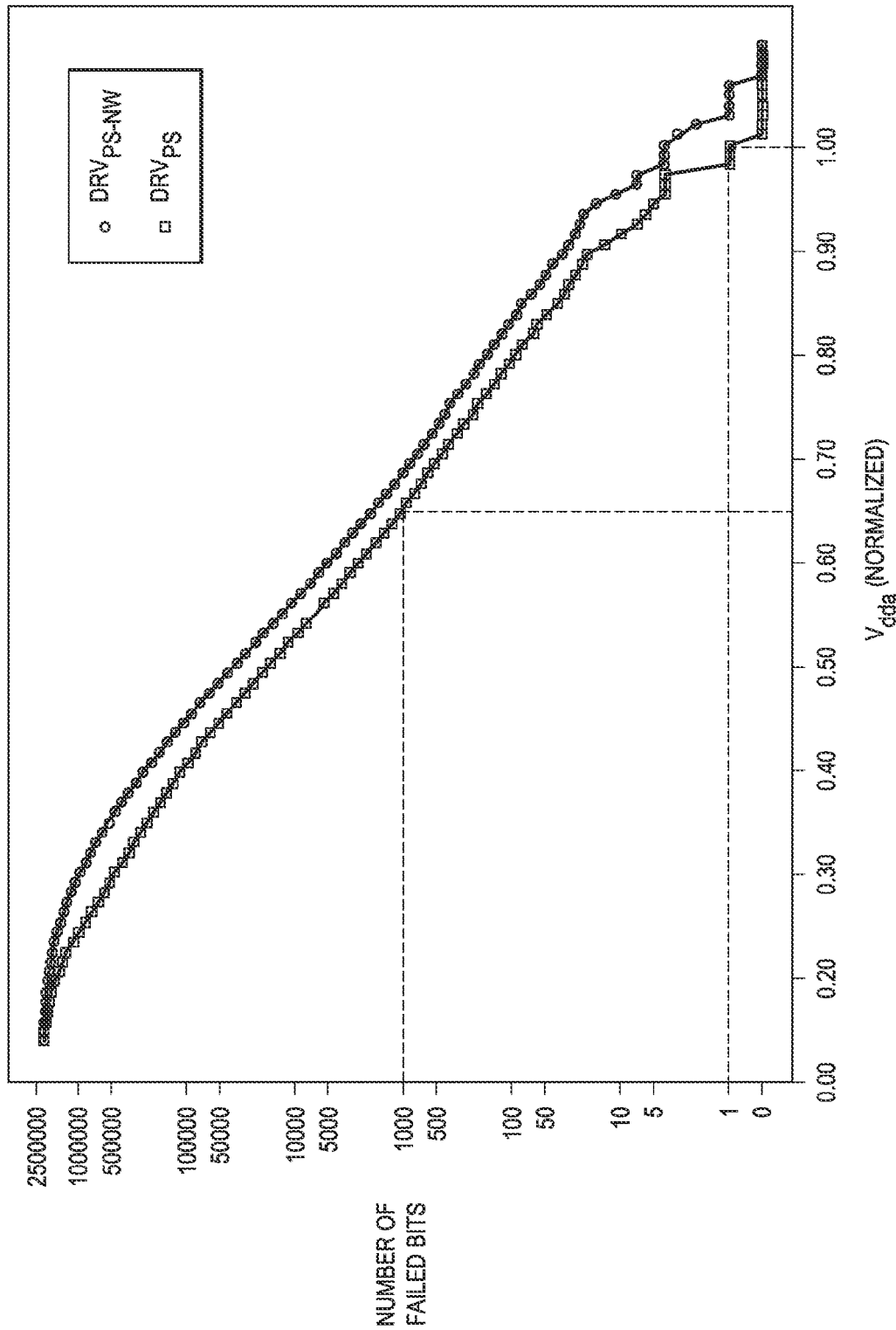
FIG. 3 is a plot of data retention bit failures versus bias voltage in a typical memory array.

FIG. 3 illustrates the variation of DRV among memory cells 22 in a typical memory array, for example an array of 2 Mbit in size. Curve $DRV_{PS-NW}$ illustrates the DRV variation for the bias condition in which only power supply voltage $V_{dda}$ is reduced (the n-well voltage is separately biased to a constant high voltage, such as 1.8 volts); curve $DRV_{PS}$ illustrates the DRV variation for the case in which the n-well voltage follows power supply voltage $V_{dda}$ (as in FIG. 2). Referring to curve $DRV_{PS}$, with the weakest cell 22 in the array having a normalized DRV of 1.0, the best cell retains its data state at a power supply voltage $V_{dda}$ corresponding to about 0.10 of the DRV of the weakest cell 22. The shift between curves $DRV_{PS}$ and $DRV_{PS-NW}$ indicates that the increased gated diode leakage, due to the higher n-well voltage, degrades the DRV; however, in some cases, reduction in the sub-threshold leakage under this bias may improve the DRV.

According to conventional data retention schemes, power supply voltage $V_{dda}$ would be set, in data retention mode, at a level at or above the weakest cell 22 DRV (i.e., at or above the normalized level 1.0 in FIG. 3) to ensure that no cell 22 would be biased below its DRV. According to embodiments of this invention, power supply voltage $V_{dda}$ can be at a retention mode level that is much lower than this worst-case DRV, saving additional power without the loss of data, as will be described in further detail below.

An example of the construction of a solid-state random access memory in integrated circuit 10, according to embodiments of this invention, is illustrated in FIG. 4a for the example of RAM 18. Alternatively, this or a similar construction may be used to realize other memory resources such as cache memory 16; further in the alternative, RAM 18 may correspond to a stand-alone memory integrated circuit (i.e., rather than as an embedded memory as shown in FIG. 1). Those skilled in the art having reference to this specification will comprehend that the memory architecture of RAM 18 in FIG. 4a is provided by way of example only.

In this example, RAM 18 includes many memory cells 22 arranged in rows and columns within memory array 30. In this example, memory array 30 includes m rows and n columns of SRAM cells 22, with cells in the same column sharing a pair of bit lines BLT[n−1:0], BLB[n−1:0], and with memory cells in the same row sharing one of word lines WL[m−1:0]. Row decoder 35 receives a row address value indicating the row of memory array 30 to be accessed, and energizes the one of word lines WL[m−1:0] corresponding to that row address value. Column select circuit 32 receives a column address value, and in response selects pairs of bit lines BLT[n−1:0], BLB[n−1:0] associated with one or more columns to be placed in communication with read/write circuits 34. Read/write circuits 34 are constructed in the conventional manner, for example to include the typical differential amplifier coupled to the bit lines for a column as selected by column select circuit 32 and a write circuit for selectively pulling toward ground one of the bit lines in the selected pair, depending on the state of read/write control signal R/W_. In the example of RAM 18 shown in FIG. 4a, column select circuit 32 selects which columns are read and written by read/write circuits 34, and are thus in communication with data bus DATA I/O.

According to the embodiment of the invention shown in FIG. 4a, array 30 of RAM 18 is arranged into four retention domains 40a through 40d. As shown in the example of FIG. 4a, each of retention domains 40a through 40d extends across full rows of array 30, and as such are each defined within ranges of row addresses. Each retention domain 40a through 40d is associated with an instance of bit line precharge circuitry 37a through 37d, respectively, which applies a desired precharge voltage to the pairs of bit lines BLT[n−1:0], BLB[n−1:0] in advance of read and write operations. The separate instances of bit line precharge circuitry 37a through 37d allow independent disabling of bit line precharge in retention mode, allowing the bit lines to "float" during the retention mode. Bit lines BLT[n−1:0], BLB[n−1:0] are thus segmented among retention domains 40a through 40d, by way of local multiplexers or other conventional approaches. Other approaches to defining retention domains (i.e., including by ranges of column addresses instead of or in combination with row addresses) are of course contemplated. In any such arrangement, it is desirable that the energizing of a given word line $WL_j$ turns on pass transistors 25a, 25b only in cells 22 that are within a retention domain currently in the active operating mode (i.e., not accessing cells 22 residing in a domain currently in retention mode). As such, separation of retention domains 40a through 40d according to row addresses is generally convenient.

Bias control circuitry 42 applies the appropriate level of power supply voltage $V_{dda}$ to each of the various retention domains 40a through 40d, according to the current operating mode for those domains. Bias control circuitry 42 may be constructed in the conventional manner, for example including circuitry for generating the operating and retention levels for power supply voltage $V_{dda}$ from a master power supply voltage ($V_{dd}$ as shown in FIG. 4a), as well as multiplexing circuitry to forward the appropriate voltages to the retention domains 40a through 40d. Bias control circuitry 42 may similarly control and apply n-well bias voltages to each of retention domains 40a through 40d, depending also on their current mode (e.g., normal operating mode or retention mode); alternatively, the n-well voltage may simply be connected to power supply voltage $V_{dda}$ at one or more locations within array 30. In addition, as indicated in FIG. 4a, bias control circuitry 42 also controls the bias applied to precharge circuitry 37, according to the operating mode for the various domains. Retention control signals RET_CTRL are shown as received by bias control circuitry 42 in this regard. Because it is desirable for the bit lines BLT, BLB for those retention domains 40a through 40d to remain floating during retention mode, it is contemplated that bit line precharge circuitry 37 may be realized in separate instances for each of retention domains 40a through 40d; alternatively, bit line precharge circuitry 37 (and bit lines BLT, BLB themselves) may be shared by cells 22 in the same column, extending through all of retention domains 40a through 40d.

According to this embodiment of the invention, retention control logic 45 is implemented in RAM 18, for controlling the entry and exit of its retention domains 40a through 40d into and out of the retention mode. In this regard, retention control logic 45 receives retention control signals RET_CTRL from elsewhere in integrated circuit 10, and has outputs including full or partial row address values applied to row decoder 35, and full or partial column address values applied to column select circuit 32. In this embodiment of the invention, retention control logic 45 also generates error correction coding (ECC) enable signal ECC_EN, and applies that signal ECC_EN to ECC encoder/decoder 44, which is in turn coupled to input/output lines DATA_I/O. In some implementations, it may be useful for retention control logic 45 to issue one or more retention control signals RET_CTRL to bias control circuitry 42, to control the timing at which retention levels are applied to retention domains 40a through 40d, as will be discussed below.

ECC encoder/decoder 44 is constructed in the conventional manner, in a manner capable of receiving "payload" data bits on input/output lines DATA_I/O and generating a code word based on those payload data, and also in a manner capable of receiving a code word on input/output lines DATA_I/O and recovering the payload data from the code word. The particular construction and operation of ECC encoder/decoder 44 of course depends on the particular error correction code being implemented. Examples of error correction codes suitable for use in connection with embodiments of this invention include the well-known Hamming codes.

Retention control logic 45 may be realized by way of sequential logic (i.e., a state machine) for determining and generating the appropriate control signals within RAM 18 for entry and exit of a given retention domain 40q into and out of a particular mode (i.e., normal operating mode, or data retention mode). Alternatively, retention control logic 45 may be combinational or programmable logic for carrying out those operations within RAM 18, for example in response to control signals or computer program instructions generated or stored elsewhere within integrated circuit 10. Further in the alternative, retention control logic 45 may be realized within or as part of a separate control or processor function within integrated circuit 10, such as system control 14, or microprocessor 12. It is contemplated that those skilled in the art having reference to this specification can readily realize and implement retention control logic 45, as well as bias control circuit 42, ECC encoder/decoder 44, and such other circuitry within and external to RAM 18 as appropriate for implementing the functions described below in connection with embodiments of this invention.

According to embodiments of this invention, ECC encoder/decoder 44 is enabled upon entry into and exit from retention mode for a given retention domain 40$q$, to allow for the correction of data retention errors caused by power supply voltage $V_{dda}$ being applied by bias control circuit 42 being below the worst case DRV (i.e., the DRV for the poorest cells 22) for that retention domain 40$q$. Referring again to FIG. 3, curve $DRV_{PS}$ indicates that about 1000 bits out of that example of a 2 Mbit memory array lose their stored data state at a power supply voltage $V_{dda}$ that is about two-thirds the DRV of the weakest cell 22 (at the normalized level 1.0). And it has been observed, in connection with this invention, that those cells failing at the highest DRV levels are typically randomly distributed, in the spatial sense, within the memory array.

According to the embodiment of this invention, shown by the example of FIG. 4$a$, retention control logic 45 controls ECC encoder/decoder 44 to encode code words upon entry based on the contents of a given retention domain 40$q$ entering into retention mode, and to access and decode those code words to recover those contents upon exit of retention domain 40$q$ from retention mode. As known in the art, this decoding has the effect of correcting bits that erroneously change state after encoding; the number of bits correctable in a given code word depends on the particular ECC code used. Because of this error correction capability, the level of power supply voltage $V_{dda}$ can be substantially lowered in this retention mode according to this embodiment of the invention, substantially reducing the retention mode power consumption. In the example of curve $DRV_{PS}$ of FIG. 3, and for the case in which the error correction code applied by ECC encoder/decoder 44 is capable of correcting for up to 1000 errored bits randomly distributed over a 2 Mbit retention domain 40$q$, power supply voltage $V_{dda}$ can be lowered by about one-third, in retention mode, from the worst case level defined by the poorest cell 22 in that population (at normalized level 1.0).

Referring now to FIG. 5$a$, the operation of RAM 18 in entering one of retention domains 40$a$ through 40$d$ into the retention mode, according to embodiments of this invention, will now be described. For purposes of this description, this operation will refer to a given retention domain 40$q$, which is one of retention domains 40$a$ through 40$d$ of array 30 in the architecture of FIG. 4$a$. It will be understood, however, that array 30 may be arranged as a single "retention domain", in which case the entire array 30 enters the retention mode according to this process. It is contemplated that such various alternatives to this operation will be apparent to those skilled in the art having reference to this specification.

The operation of RAM 18 in this regard begins with process 50, in which retention domain 40$q$ is operating and being accessed in a normal operating mode. In the normal operating mode of process 50, power supply voltage $V_{dda}$ applied to each cell 22 of retention domain 40$q$ is at its full operating level, permitting read and write access to each of its cells 22 indicated by the row and column addresses applied to row decoder 25 and column select circuit 32 in the conventional manner. It is contemplated that the n-well voltage applied to the body nodes of p-channel transistors 23$a$, 23$b$ in each cell 22 of retention domain 40$q$ is also at its normal operating level (e.g., at power supply voltage $V_{dda}$ or greater). During process 50, retention control signals RET_CTRL applied to retention control logic 45 will indicate the normal operating mode for retention domain 40$q$; in response, retention control logic 45 will disable ECC encoder/decoder 44 for accesses to retention domain 40$q$, by way of enable signal ECC_EN. As such, read and write accesses from and to retention domain 40$q$ during process 50 are performed without error correction decoding (on data read) or encoding (on data write). Maximum performance of RAM 18 for these accesses is therefore available.

In process 52, retention control logic 45 determines, or receives, an indication that retention domain 40$q$ is to exit its normal operating mode and enter the retention mode, in which its cells 22 will be biased at a reduced voltage and to which access is inhibited. It is contemplated that process 52 may be performed in any one of a number of ways. As suggested by FIG. 4$a$, it is contemplated that retention control signals RET_CTRL generated externally from RAM 18 (e.g., by microprocessor 12 according to executed program instructions) may indicate this retention mode entry to retention control logic 45. Alternatively, a timer (not shown) may be provided, within or externally to RAM 18, monitoring addresses applied to row decoder 35 or some other indication of access activity, to determine whether retention domain 40$q$ has not been accessed over a preselected time duration, and to notify retention control logic 45 of that event. Further in the alternative, retention control logic 45 may receive a signal from bias control circuitry 42, in response to a retention request contained within retention control signals RET_CTRL received by it. Other determinations of the entry of retention domain 40$q$ into retention mode may alternatively be applied.

Upon receiving or generating the indication of retention mode in process 52, retention control logic 45 initiates process 54, in which those locations of retention domain 40$q$ storing data that are to be retained in the retention mode (i.e., to persist) are identified. In the context of the system-on-a-chip of integrated circuit 10, it is contemplated that memory management functionality in system control 14 or microprocessor 12 will have identified those portions of RAM 18 that are protected, those in use, and those available (i.e., "free" memory), during the normal operation of process 50. In the context of a stand-alone RAM 18, it is contemplated that some other circuitry within or external to RAM 18 will maintain such a memory table or index.

In process 56, retention control logic 45 controls row decoder 35, column decode 32, and read/write circuits 34, to read the contents of those cells 22 in retention domain 40$q$ identified in process 54 as storing data to be retained, and controls ECC encoder/decoder 44 to encode those read data into code words according to an error correction code. For example, it is contemplated that the payload data to be encoded in a given code word will be the contents of some or all of the cells 22 residing in the same row of retention domain 40$q$, and thus sensed in the same memory cycle. In this embodiment of the invention, as mentioned above, the particular ECC code used by ECC encoder/decoder 44 can correspond to any one of a number of conventional error correction codes. In any case, it is of course desirable that the selected ECC code be capable of correcting errors at a rate greater than the number of expected data retention failures at the reduced power supply voltage to be applied in the retention mode, assuming random distribution with expected statistical variations. The code applied by ECC encoder/decoder 44 may be a "systematic" code, in which the payload data (i.e., the contents read from retention domain 40$q$) are retained intact in the code word, with parity bits (i.e., the "code" bits) appended to the payload data, or a "non-systematic" code in which the payload data are encoded in combination with the parity bits, so that the payload data bits input to the encoding process are not embedded within the resulting code word (i.e., one cannot identify the payload bits in the code word). In either case, each code word generated in process 56 will be longer than the corresponding payload data, in order to provide the necessary redundancy for error correction to the desired level. For the example of a [31, 26, 3] Hamming code, which is a systematic code, a 31-bit code word is generated, including 26 bits of payload data and five parity bits.

In process 58, the parity bits of the code word generated in process 56 are written to available memory locations (i.e., cells 22) in RAM 18. The cells 22 at the memory locations written in process 58 will differ from those cells 22 read in process 56, in order to store the additional bits of the code word generated in process 56. For the example of a systematic ECC code, in which the payload data are retained intact, those cells 22 written in process 58 will be written with the parity bits only; the payload data read in process 56 are maintained in their current cells 22 in retention domain 40$q$, because these contents do not change in the encoding process. Alternatively, if a non-systematic ECC code is used, process 58 will rewrite both the previously accessed memory locations and also additional available cells 22, because the payload data are also encoded into the code word (and are thus altered); of course, the entirety of the non-systematic code word may be written to different cells 22 (including cells 22 within retention domain 40$q$) than those read in process 56 and containing the code word; the read cells 22 may then be identified as "available" as their contents are no longer necessary.

The memory locations into which the additional bits (i.e., the parity bits) generated in process 56 are written in process 58 may be in any of the retention domains 40$a$ through 40$d$ of array 30, and as such need not be within the retention domain 40$q$ being placed in retention mode. To facilitate exit from retention mode, however, it is desirable that the additional bits (i.e., the parity bits) of the data word written in process 58 reside in a retention domain 40$a$ through 40$d$ that will either be active upon the exit of retention domain 40$q$ from retention mode, or reside in retention domain 40$q$ itself, to avoid requiring an additional domain to exit retention mode in order to recover data for retention domain 40$q$ itself. It is contemplated that writing these parity bits into available memory locations within retention domain 40$q$ itself will generally facilitate recovery of these data upon exit from retention mode.

It is contemplated that processes 56, 58 will be performed for all memory locations of retention domain 40$q$ identified, in process 54, as storing data that is to persist through retention mode. As such, upon the writing of the parity bits (if not the entire code word) in process 58 for a given code word, retention control logic 45 will determine if additional memory locations within retention domain 40$q$ remain to be encoded; if so, processes 56, 58 are repeated.

As suggested in the architecture of FIG. 4$a$, it is contemplated that retention control logic 45 can carry out processes 56, 58 by applying address information to row decoder 35 and column select circuit 32, and the appropriate levels at read/write enable signal R/W_, in the appropriate manner for reads of and writes to the desired locations in retention domain 40$q$. Alternatively, retention control logic 45 may instead issue an interrupt or some other control signal to provoke other circuitry within integrated circuit 10, such as microprocessor 12 or a memory management circuit (not shown), to present the appropriate address and control signals to RAM 18 to perform these processes. Other locations in RAM 18 itself, or a separate buffer or other memory, may also be involved to store the results of the ECC encoding performed by ECC encoder/decoder 44 in this connection.

Upon the writing of the parity bits for all read contents of retention domain 40$q$ in process 58, retention domain 40$q$ can then be placed into retention mode. In process 60, bias control circuit 42 (e.g., under the control of retention control logic 45) reduces power supply voltage $V_{dda}$ to the desired retention level. As mentioned above, in some implementations, on completion of process 58, retention control logic 45 issues a control signal via retention control signals RET_CTRL to bias control circuit 42 to then enable application of the retention level bias in process 60; this ensures that the retention level bias is not prematurely applied, i.e. before process 58 is completed. Other voltages may also be modulated in process 60 as desired for retention mode, including the n-well voltage applied to the body nodes of p-channel transistors 23$a$, 23$b$ in each cell 22 in retention domain 40$q$; in addition, bit line precharge circuitry 37$q$ may be disabled for retention domain 40$q$, allowing those bit lines to "float" during the retention mode for retention domain 40$q$. Upon completion of process 60, retention domain 40$q$ is then in the retention mode.

The particular level of power supply voltage $V_{dda}$ applied to cells 22 during retention may be determined by measurement, characterization, or simulation. For example, each retention domain 40$a$ through 40$d$, in each manufactured integrated circuit 10, may be evaluated during manufacturing test to determine a suitable retention bias voltage. Such a test may be performed by: writing the contents of a retention domain 40$q$; reducing power supply voltage $V_{dda}$ to a preselected low level; reading the contents of retention domain 40$q$ and recording the number of failures; and repeating this sequence at ever-decreasing power supply voltage $V_{dda}$. The particular power supply voltage $V_{dda}$ level at which a tolerable percentage of retention failures occurs can then be selected, by programming a register location or by conventional "trimming" at the time of manufacturing test. It is contemplated that some margin is provided in this selected retention voltage, to account for later-life degradation of cells 22, "random telegraph noise" modulation, and the like.

Referring now to FIG. 5$b$, the operation of RAM 18 in "waking up" retention domain 40$q$ from its retention mode for entry into normal operating mode, according to an embodiment of the invention, will now be described. This wake-up process begins with process 62, in which retention control logic 45 receives an indication, or itself determines, as the case may be, that retention domain 40$q$ of array 30 is to exit the retention mode and enter the normal operating mode. It is contemplated that this indication or determination may be carried out in any one of a number of ways, depending on the architecture of RAM 18 and the desired manner of operation. For example, retention control logic 45 may receive an indication from row decoder 35 that it has received a row address corresponding to a row of cells 22 in retention domain 40$q$, or retention control logic 45 may itself "snoop" the row address values to itself detect an access to retention domain 40$q$. Alternatively, in the context of integrated circuit 10, microprocessor 12 may execute program instructions indicating that retention domain 40$q$ is to be placed in its normal operating mode, perhaps in advance of an access to locations in that retention domain 40$q$. Still further in the alternative, bias control circuitry 42 may receive a signal from within or external to RAM 18, indicating that retention domain 40$q$ is to be biased at its normal operating power supply voltage $V_{dda}$. It is contemplated that process 62 may be carried out by any of these, or other, indications of the entry into the normal operating mode for retention domain 40q.

In response to its identifying of the entry of retention domain 40q into normal operating mode in process 62, retention control logic 45 forwards a control signal to bias control circuit 42 to increase the bias voltage applied to cells 22 in retention domain 40q, in process 64. In this process 64, power supply voltage $V_{dda}$ is raised from its retention mode level to its normal operating level, as is the n-well voltage (at the body nodes of p-channel transistors 23a, 23b in each cell 22) of retention domain 40q, if that n-well voltage differs from its normal level when in retention mode. In addition, bit line precharge circuitry 37 is controlled by bias control circuit 42 to precharge bit lines BLT, BLB associated with retention domain 40q, also in process 64.

Upon the power supply voltage $V_{dda}$, n-well voltage (if applicable), and bit line precharge voltage reaching operational levels following process 64, retention control logic 45 next initiates the reading of the stored ECC code words for those memory locations of retention domain 40q that are to store the data intended to persist through the duration of the retention mode. It is contemplated that retention control logic 45 itself, or some other memory resource available to retention control logic 45, will store the memory addresses of those code words, including addresses within the address space of retention domain 40q itself and addresses of cells 22 in other retention domains 40a through 40d storing the parity bits corresponding to the payload data (or additional code word portion, for non-systematic ECC codes) stored in retention domain 40q. As mentioned above, it is desirable that the memory locations used to store the parity bits (or extra portion of the code word) reside in retention domain 40q itself, or reside in a different retention domain 40a through 40d that is in its normal operating mode at the time that retention domain 40q exits the retention mode, so that another retention domain need not be pulled from its retention mode solely to recover those parity bits upon the return of retention domain 40q to normal operation.

In the architecture of FIG. 4a, for example, retention control logic 45 is capable of forwarding those addresses in the appropriate sequence to row decoder 35 and column select circuit 32, in combination with a read enable signal to read/write circuits 34 via control line R/W_, and thus initiating the appropriate read cycles in RAM 18 to read these stored code words. Also in process 66, retention control logic 45 issues an enable signal on line ECC_EN, enabling ECC encoder/decoder 44 to decode the accessed code words and thus recover the original payload data intended to be retained in retention domain 40q while in the retention mode.

Upon recovery of the payload data in process 66, retention control logic 45 in combination with ECC encoder/decoder 44 write that recovered payload data to the corresponding cells 22 in retention domain 40q, in process 68. This re-writing process 68 thus corrects any errored bits in the payload data read in process 66 after the exit from retention mode; as described above, power supply voltage $V_{dda}$ is at a level, during retention mode, at which loss of a small percentage of stored data is not unexpected (indeed, such data loss may be fully expected). For systematic codes, it is contemplated that rewriting process 68 will, in the vast majority of cases, largely be re-writing the same data to the addressed cells 22 as read in process 66; conversely, for non-systematic codes, rewriting process 68 will be over-writing cells 22 with the payload data as derived from ECC decoding, which will differ from the data read in process 66. Typically, process 68 will rewrite the payload data to the same memory locations in retention domain 40q from which the corresponding portion of the code word was read in process 66, so that accessing circuitry external to RAM 18 (e.g., microprocessor 12) can access the desired data from the expected memory locations.

It is contemplated that processes 66, 68 will typically be performed sequentially on a code word-by-code word basis (i.e., one code word at a time), until all of the payload data that is to persist through retention mode for retention domain 40q are recovered. As such, upon the writing of the payload bits in process 68 for a given code word, retention control logic 45 will determine if additional code words remain to be recovered for retention domain 40q; if so, processes 66, 68 are repeated for those additional code words.

Upon completion of processes 66, 68 for all relevant locations of retention domain 40q (i.e., those locations intended to store the persistent data), those memory locations used to store the parity bits (or additional code word portion, for non-systematic ECC codes) associated with the recovered payload data are no longer necessary. This is because re-writing process 68 writes only the payload data to the addressed cells of retention domain 40q after ECC decoding of the code words as stored during retention mode; no parity bits remain associated with this re-written payload data. Accordingly, in process 70, retention control logic 45 releases the memory locations used to store those parity bits during the retention mode, enabling the corresponding cells 22 at those locations to be rewritten with such data as desired by circuitry external to RAM 18. This release of process 70 is accomplished in a manner consistent with the architecture and operation of integrated circuit 10, for example by updating a memory table or address list to indicate that these memory locations are now "free" memory. As mentioned above, these released memory locations may be within retention domain 40q itself, within a different retention domain 40a through 40d of array 30, or in a scratchpad memory or other available memory resource in integrated circuit 10.

Also in process 70, according to this embodiment of the invention, retention control logic 45 disables ECC encoder/decoder 44 from operation during subsequent read and write accesses to cells 22 in retention domain 40q when in normal operating mode. In other words, during the normal operating mode, reads of data from cells 22 in retention domain 40q in normal operating mode are not error-corrected, nor are writes of data to cells 22 in retention domain 40q encoded according to an error correction code. Such subsequent reads and writes from and to memory locations in retention domain 40q, in the normal operating mode, then occur in process 72 during the normal course of operation of integrated circuit 10, to the extent that such read and write accesses are requested from external to RAM 18.

Embodiments of this invention provide important advantages in the operation of solid-state random access memory, such as SRAM memory resources. More particularly, embodiments of this invention enable the reduction of the bias applied to memory cells during a data retention mode from that voltage limited by the weakest memory cell in the memory array or retention domain, to a much lower voltage corresponding to a correctable number of retention errors; error correction coding upon entry into retention mode, and decoding upon exit from the retention mode, corrects any such data retention errors that result from that lowered cell bias voltage. The variation of data retention voltage (DRV) among cells within memory arrays or retention domains is especially wide for memories constructed according to modern sub-micron manufacturing technology, because of the wider cell-to-cell variation of transistors at those feature sizes. Therefore, especially in modern integrated circuits, substantial power savings during data retention mode are thus attained.

In addition, according to embodiments of this invention, the error correction encoding and decoding is applied only upon entry into and exit from retention mode; as such, embodiments of this invention may be implemented in high performance memories, such as cache memories and other high-speed SRAM memory, without impacting the read access time or write cycle time during normal operation. In addition, embodiments of this invention may be realized in a very efficient manner, from the standpoint of memory utilization, because memory cells need not be constructed for storing the additional parity bits necessary for this error correction coding; rather, according to embodiments of this invention, otherwise available or "free" memory may be used to store those parity bits associated with the payload data in retention mode, with that parity bit memory then released for use upon exit from the retention mode.

As mentioned above, the performance of the memory is not reduced by embodiments of this invention, because the ECC encoding and decoding is not performed during normal operation of the memory, but rather is performed upon entry into and exit from the data retention mode. It is further contemplated that the time required to perform this ECC encoding and decoding according to embodiments of this invention does not impact the performance of the memory to any significant extent. The time required for ECC encoding during entry into retention mode is not of critical importance in the operation of the memory, considering that the data will not be accessed during the retention mode. Conversely, the time required for ECC decoding during the exit from retention mode is not of critical importance either, considering that the "wake-up" process for modern memories typically occupies several microseconds or longer, due to the R-C delays involved in charging the various elements within the memory retention domain from the lower retention voltage level to the voltages required for normal operation. As such, the additional time involved in ECC decoding of the data upon recovery from retention mode is typically not critical. Performance of the memory is therefore not degraded, to any significant extent, by implementation of embodiments of this invention.

Figure 4B:
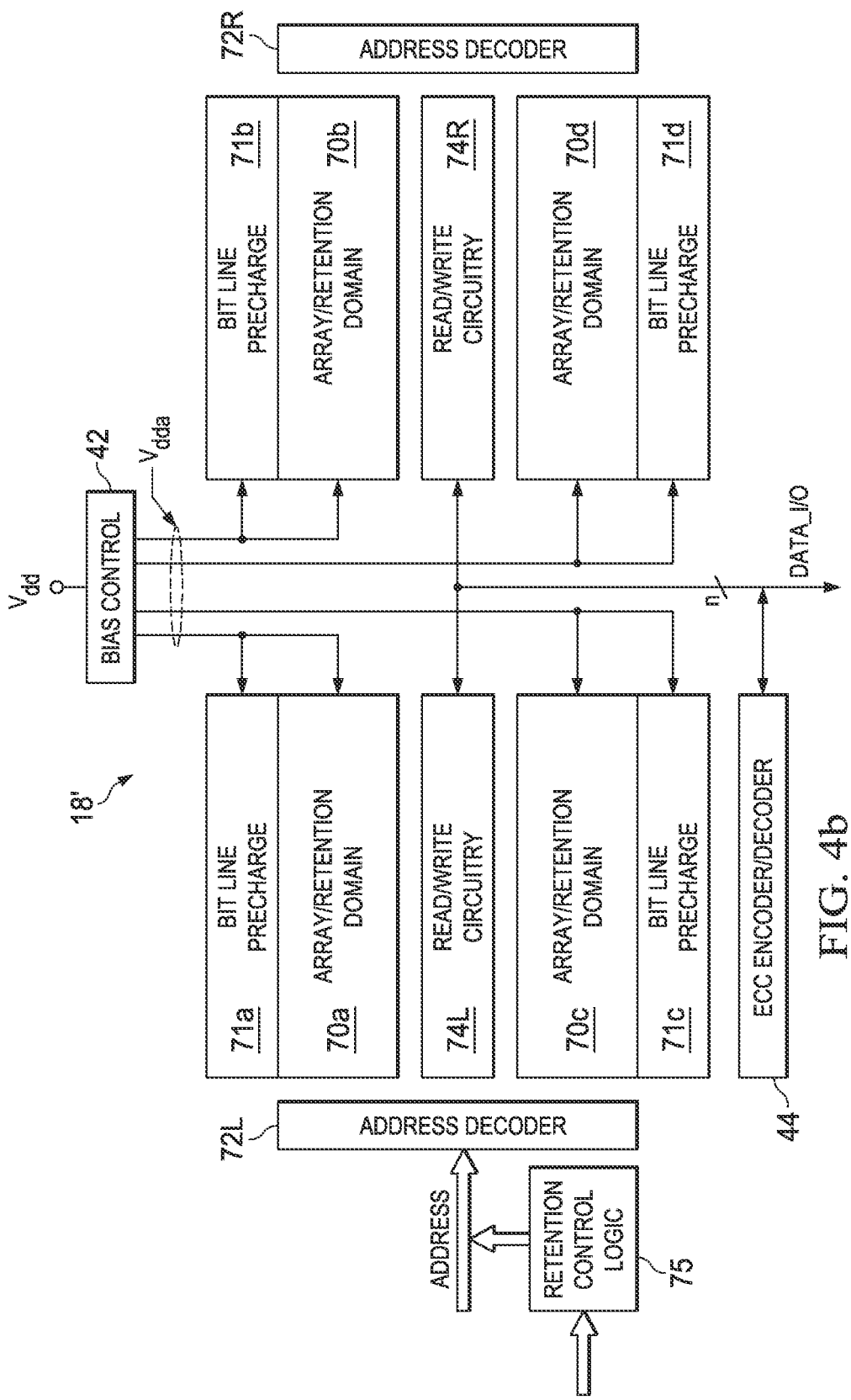

While a single instance of memory array 30 is shown in FIG. 4a, it is to be understood that RAM 18 may include multiple memory arrays, each corresponding to a memory block within the address space of RAM 18. FIG. 4b illustrates an example of the architecture of RAM 18' according to such an architecture, according to embodiments of this invention. Like elements in RAM 18' of FIG. 4b as in RAM 18 of FIG. 4a are referred to by the same reference numerals.

According to the arrangement of FIG. 4b, RAM 18' is organized into multiple arrays 70a through 70d, each of which also constitutes a separate retention domain and can thus be independently placed into retention mode, or into normal operating mode, according to the processes described above relative to FIGS. 5a and 5b. In the architecture of FIG. 4b, the separate arrays 70a through 70d each receive power supply voltage $V_{dda}$ from bias control circuit 42 as before. Each array 70a through 70d is associated with a separate instance of bit line precharge circuitry 71a through 71d, which receives the same power supply voltage $V_{dda}$ as its associated array 70a through 70d, respectively. In this architecture, read/write circuitry 74L is shared by arrays 70a, 70c, and read/write circuitry 74R is shared by arrays 70b, 70d. Each of read/write circuitry instances 74L, 74R are in communication with input/output data lines DATA I/O, to which ECC encoder/decoder circuitry 44 is coupled as in the arrangement of FIG. 4a. Similarly, circuitry for decoding addresses is split into two portions, with address decoder 72L disposed near arrays 70a, 70c, and address decoder 72R disposed near arrays 70b, 70d. Address decoder instances 72L, 72R may be duplicates of one another, for controlling the addressing of their associated arrays 70, or alternatively may split the overall decoding function within RAM 18'.

In RAM 18' according to the architecture of FIG. 4b, a single instance of retention control logic 75 is provided, and thus controls the entry into and exit from retention mode for each of arrays/retention domains 70a through 70d, in the manner described above relative to FIGS. 5a and 5b. As before, retention control logic 75 receives retention control signals from elsewhere within or external to RAM 18', and also has address lines coupled to address decoder 74L and 74R (not shown for clarity), by way of which retention control logic 75 can control the reading of data from selected locations of arrays 70a through 70d for ECC encoding by ECC encoder/decoder 44, and storing of parity bits, in entering retention mode (FIG. 5a), and the reading of code words and writing of decoded payload data back into selected locations of arrays 70a through 70d upon exit from the retention mode (FIG. 5b).

Figure 4C:
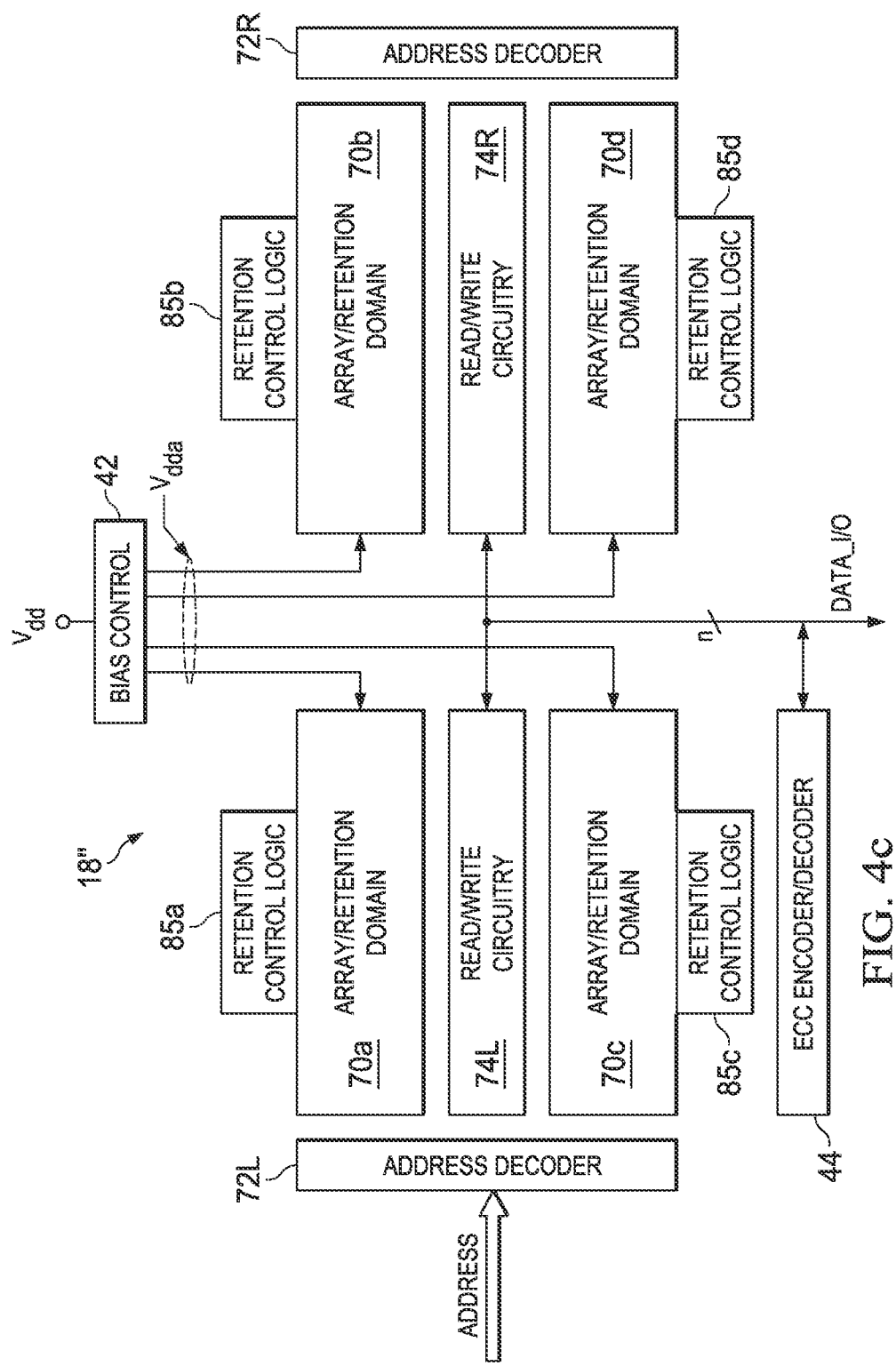

FIG. 4c illustrates an example of the architecture of RAM 18" according to another example of memory architecture, according to embodiments of this invention. Like elements in RAM 18" of FIG. 4c as in RAM 18' of FIG. 4b are referred to by the same reference numerals.

RAM 18" of FIG. 4c is quite similar to RAM 18' of FIG. 4b, with multiple arrays 70a through 70d, each serving as a separate retention domain that can be independently placed into retention mode, or into normal operating mode, according to the processes described above relative to FIGS. 5a and 5b. As before, these separate arrays 70a through 70d each receive power supply voltage $V_{dda}$ from bias control circuit 42, and each is associated with separate bit line precharge circuitry (not shown in FIG. 4c). Read/write circuitry 74L is shared by arrays 70a, 70c, and read/write circuitry 74R is shared by arrays 70b, 70d, and each of read/write circuitry instances 74L, 74R are in communication with input/output data lines DATA I/O, to which ECC encoder/decoder circuitry 44 is coupled. Address decoder 72L is disposed near arrays 70a, 70c, and address decoder 72R is disposed near arrays 70b, 70d.

In RAM 18" according to the architecture of FIG. 4c, however, each array/retention domain 70a through 70d is associated with its own instance of retention control logic 85a through 85d, respectively. Retention control logic 85a controls the entry into and exit from retention mode for array/retention domain 70a, while retention control logic 85b controls the entry into and exit from retention mode for array/retention domain 70b, and so on. Each of retention control logic instances 85a through 85d receives retention control signals from elsewhere within or external to RAM 18', and is coupled to address decoder 74L and 74R to control the reading of data from selected locations of its associated array 70a through 70d, respectively. The operation of retention control logic instances 85a through 85d otherwise follows the procedure described above in connection FIG. 5a for placing its associated array 70a through 70d, respectively, into retention mode, and follows the procedure described above in connection FIG. 5b for exit from the retention mode.

It is, of course, contemplated that embodiments of this invention may be realized in other memory architectures beyond those shown by way of example in FIG. 4a through 4c, and with alterations to the overall method of controlling such memory mode control as may be appropriate to those architectures. In each of these and alternative architectures, it is contemplated that embodiments of this invention can provide the important advantages of allowing the cell bias voltage to be greatly reduced for memory arrays in retention mode, lower than the voltage indicated by the weakest cell in the array, and thus substantially reducing retention power consumption. According to embodiments of this invention, that reduced power consumption is attained without jeopardizing the contents to be retained, and without impacting memory performance in the normal operating mode. In addition, error correction is incorporated according to embodiments of this invention by using otherwise available memory locations, and freeing the memory required for storage of parity bits during retention mode for general use in the normal operating mode.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a solid-state memory in an integrated circuit, the memory comprised of random-access memory cells, each biased by a power supply voltage at a first bias voltage during normal operation, comprising:
   receiving a retention mode signal indicating entry into a retention mode;
   responsive to the retention mode signal, reading payload data corresponding to the contents of a first plurality of the memory cells in a first retention domain of the memory;
   generating a code word corresponding to the payload data, the code word having a number of bits in the code word greater than the number of memory cells in the first plurality of memory cells;
   storing at least a portion of the code word in a second plurality of memory cells in the integrated circuit;
   then reducing the bias to memory cells in the first retention domain to a voltage below the first bias voltage;
   then receiving a normal operation mode signal indicating entry into a normal operation mode;
   responsive to the normal operation mode signal, increasing the bias to the memory cells in the first retention domain;
   reading the contents of the first and second pluralities of memory cells;
   decoding the read contents of the first and second plurality of memory cells to recover payload data from the read contents; and
   storing the recovered payload data in the first plurality of memory cells.

2. The method of claim 1, wherein the generating step generates a code word comprised of a payload portion and a parity portion;
   and wherein the step of storing at least a portion of the code word stores the parity portion in the second plurality of memory cells.

3. The method of claim 1, wherein the second plurality of memory cells are within the first retention domain.

4. The method of claim 1, wherein the memory further comprises a second retention domain, the second plurality of memory cells within the second retention domain.

5. The method of claim 1, wherein the memory is arranged in a plurality of retention domains;
   and wherein the received retention mode signal indicates entry of the first retention domain into the retention mode.

6. The method of claim 1, wherein the memory is arranged in a plurality of arrays;
   wherein the first retention domain includes memory cells within at least first and second ones of the plurality of arrays.

7. The method of claim 1, further comprising:
   after the step of storing the recovered payload data in the first plurality of memory cells following the step of receiving the normal operation mode, rewriting the contents of the second plurality of memory cells.

8. The method of claim 1, further comprising:
   after the step of storing the recovered payload data in the first plurality of memory cells following the step of receiving the normal operation mode, reading the contents of the first plurality of memory cells without accessing the second plurality of memory cells.

9. The method of claim 1, further comprising:
   before the step of receiving the retention mode signal, testing the memory cells in the first array to identify a second bias voltage at which fewer than a predetermined number of the memory cells fail to retain stored data states;
   and wherein the reducing step reduces the bias to the memory cells in the array to the second bias voltage.

10. The method of claim 1, wherein each of the memory cells comprises a pair of cross-coupled inverters, each inverter comprising a p-channel MOS transistor connected in series with an n-channel MOS transistor between a power supply voltage and a reference voltage, and having gates connected in common;
    and wherein the step of reducing the bias to memory cells in the first array comprises:
       reducing a power supply voltage, applied across the inverters of the memory cells, to a voltage below the first bias voltage; and
       modulating a well voltage coupled to body nodes of the p-channel MOS transistors in the memory cells.

11. The method of claim 1, wherein the reading, generating, and storing steps are performed over the entirety of the first retention domain responsive to the retention mode signal;
    and wherein the reading, decoding, and storing steps are performed over the entirety of the first retention domain responsive to the normal operation mode signal.

12. An integrated circuit, comprising a memory, comprising:
    solid-state memory cells arranged in rows and columns;
       each memory cell comprising:
          first and second cross-coupled inverters, each inverter comprising a p-channel metal-oxide-semiconductor (MOS) transistor and an n-channel MOS transistor with source/drain paths connected in series and with gates connected in common, each of the inverters biased by a power supply voltage; and
          first and second pass gates, coupled between first and second bit lines associated with a column including the memory cell, and the first and second inverters, respectively;
    address select circuitry, for selecting one or more of the first array of memory cells responsive to a memory address;
    read/write circuitry coupled to bit lines coupled to column of the memory cells, for reading and writing the contents of selected memory cells;

bias control circuitry, for biasing memory cells to a first bias voltage during normal operation, and to a reduced bias voltage lower than the first bias voltage in a retention mode;

error correction coding circuitry, for encoding payload data words into a code word having a number of bits greater than the number of bits in the payload data words, and for decoding code words to recover corresponding payload data words; and retention logic circuitry, having an input receiving mode control signals, for controlling the read/write circuitry, address select circuitry, and error correction circuitry to perform a sequence of operations comprising:

responsive to the retention logic circuitry receiving a mode control signal indicating entry into the retention mode:

reading payload data corresponding to the contents of a first plurality of the memory cells;

enabling the error correction coding circuitry to encode a code word corresponding to the payload data, the code word having a number of bits in the code word greater than the number of memory cells in the first plurality of memory cells; and storing at least a portion of the code word in a second plurality of memory cells; and responsive to the retention logic circuitry then receiving a mode control signal indicating entry into the normal operation mode:

reading the contents of the first and second pluralities of memory cells;

controlling the error correction coding circuitry to decode the read contents of the first and second plurality of memory cells to recover payload data from the read contents; and storing the recovered payload data in the first plurality of memory cells.

13. The integrated circuit of claim 12, wherein the sequence of operations further comprises:

after the decoding operation, disabling the error correction coding circuitry from encoding and decoding data relative to the first plurality of memory cells.

14. The integrated circuit of claim 12, further comprising:
a processor, coupled to the memory, for executing program instructions;
wherein the processor comprises the retention logic circuitry.

15. The integrated circuit of claim 12, further comprising:
a processor, coupled to the memory, for executing program instructions;
wherein the retention logic circuitry comprises sequential logic circuitry coupled to the memory.

16. The integrated circuit of claim 12, wherein the first retention domain array also includes the second plurality of memory cells.

17. The integrated circuit of claim 12, wherein the memory in the integrated circuit further comprises a second retention domain, comprising the second plurality of memory cells.

18. The integrated circuit of claim 12, wherein the memory is arranged in a plurality of retention domains;
wherein the mode control signal received by the retention logic circuitry indicates which of the plurality of retention domains is to enter the retention mode or normal operation mode;
and wherein the first and second pluralities of memory cells are contained in a first retention domain.

19. The integrated circuit of claim 12, wherein the memory is arranged in a plurality of retention domains;
wherein the mode control signal received by the retention logic circuitry indicates which of the plurality of retention domains is to enter the retention mode or normal operation mode;
wherein the first plurality of memory cells is contained in a first retention domain;
and wherein the second plurality of memory cells is contained in a second retention domain.

20. The integrated circuit of claim 19, wherein the retention logic circuitry is coupled to each of the first and second retention domains.

21. The integrated circuit of claim 19, wherein the retention logic circuitry comprises first and second portions, coupled to the first and second retention domains, respectively.

22. The integrated circuit of claim 19, wherein the memory cells are arranged in a plurality of arrays;
and wherein the first retention domain comprises memory cells in each of a first and a second array.

23. The integrated circuit of claim 12, wherein the retention logic circuitry is also for controlling the bias control circuitry;
and wherein the sequence of operations further comprises:
after the step of storing at least a portion of the code word in the second plurality of memory cells, issuing a control signal to the bias control circuitry to cause it to bias the memory cells to the reduced bias voltage.

* * * * *